(12) United States Patent
Lautenschläger et al.

(10) Patent No.: US 6,794,639 B2
(45) Date of Patent: Sep. 21, 2004

(54) OPTOELECTRONIC SENSOR DEVICE

(75) Inventors: Holger Lautenschläger, Eriskirch (DE); Armin Schaib, Blitzenreute (DE); Ralf Siegler, Schlier-Fenken (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 09/821,094

(22) Filed: Mar. 30, 2001

(65) Prior Publication Data

US 2001/0025922 A1 Oct. 4, 2001

(30) Foreign Application Priority Data

Mar. 30, 2000 (DE) .......................................... 100 15 511

(51) Int. Cl.[7] .......................... H01L 40/14; H01L 5/02
(52) U.S. Cl. .................. 250/239; 250/221; 235/462.43
(58) Field of Search ................................ 250/239, 221, 250/222.1, 559.11, 237 R; 235/454, 462.43, 462.45, 462.47, 471.01–471.03; 340/551

(56) References Cited

U.S. PATENT DOCUMENTS

| | | | | |
|---|---|---|---|---|
| 3,752,978 A | * | 8/1973 | Kahl et al. .................. 250/340 |
| 4,021,665 A | * | 5/1977 | Haas et al. ................... 250/239 |
| 4,173,717 A | * | 11/1979 | Lederer ........................ 250/239 |
| 4,346,293 A | * | 8/1982 | Fetzer .......................... 250/221 |
| 4,568,827 A | * | 2/1986 | Walter ......................... 250/239 |
| 4,727,260 A | * | 2/1988 | Krauth ................... 250/559.11 |
| 5,786,586 A | * | 7/1998 | Pidhirny et al. ....... 235/472.01 |
| 6,150,946 A | | 11/2000 | Focke |

FOREIGN PATENT DOCUMENTS

| | | |
|---|---|---|
| DE | 32 22 954 C2 | 12/1983 |
| DE | 44 34 011 C1 | 7/1995 |
| DE | 196 09 238 C2 | 9/1997 |
| DE | 197 30 341 A1 | 1/1999 |

* cited by examiner

*Primary Examiner*—Thanh X. Luu
*Assistant Examiner*—Seung C. Sohn
(74) *Attorney, Agent, or Firm*—Nixon Peabody LLP; David S. Safran (57) ABSTRACT

An optoelectronic sensor device with a housing (1) which can be adapted to a host of installation situations with the housing (1) unchanged is achieved in that there are an optics module (2) and an electronics module (3) in the housing (1).

12 Claims, 8 Drawing Sheets

OPTOELECTRONIC SENSOR DEVICE

BACKGROUND OF THE INVENTION

1. Field of the Invention

The invention relates to an optoelectronic sensor device with a housing, especially an optical proximity switch, such as a reflex light momentary contact switch or a sensor device for a one-way or reflected light photoelectric barrier. These optical proximity switches have light-emitting components, typically diodes, and preferably laser diodes as the transmitting components. Receiving components are generally large-area photodiodes. These optical proximity switches can be divided essentially into three different types, specifically into one-way systems, reflection systems, and momentary contact switch systems.

2. Description of Related Art

One way systems consist, on the one hand, of a transmitter device, and on the other, of a receiver device which is spatially separate from it. The transmitter device and the receiver device are arranged opposite one another on the side boundaries of the area to be monitored, such that light emitted by the transmitter device can be received by the receiver device. In contrast, in reflection systems, the transmitters and receivers are integrated into a single unit, therefore a single device. One such unit which represents a transmitter/receiver device is located on the outer boundary of the area to be monitored, while on the other boundary of the area to be monitored, which is opposite it, there is a reflector which reflects back the light emitted by the transmitter/receiver device onto it such that it can be received by the receiver which is integrated into the transmitter/receiver device. It is common to the two above described systems that the receiver does not receive a light signal or at least receives a reduced light signal when an object is located in the area to be monitored, since this object completely or at least partially interrupts the beam path of the light emitted by the transmitter.

Basically, different from this mode of operation is the mode of operation of optoelectronic momentary contact switch systems. In these systems, the transmitter and the receiver are, likewise, together in one unit, but there is no reflector as a component of the system. Instead, the light emitted by the transmitter in the transmitter/receiver device is reflected on the object to be detected. If at least part of this light reflected on the object to be detected is incident back on the transmitter/receiver device, this reflected light portion can be detected by the receiver.

However, in all three types of optoelectronic sensor systems, it is necessary to exactly align the optoelectronic sensor devices during their installation so that the light emitted by the transmitter is incident either directly or via reflection on the receiver. In addition, it can be necessary for the optoelectronic sensor device to be mounted in an area of the system which is only poorly accessible and/or offers only little space for mounting.

In particular, if only little space is available for the installation of the optoelectronic sensor device, and under certain circumstances, there is only one possible arrangement or orientation of the optoelectronic sensor device, it is desirable to have an optoelectronic sensor device which enables emission of light in different directions or reception of light from different directions. Accordingly, in one such optoelectronic sensor device the orientation of the transmitting and receiving unit can be adapted accordingly. At least it must be ensured that, in terms of external shape, essentially the same optoelectronic sensor devices are available in which there are receiving and transmitting units on different sides. But here, for production engineering reasons and reasons of storage, it is desirable not to produce a host of different optoelectronic sensor devices and to have to store them in order to meet the aforementioned requirements.

German Patents DE 32 22 954 C2 and DE 196 09 238 C2 disclose optoelectronic sensor devices in which, on the housing of the optoelectronic sensor device, there is a housing attachment which can be turned relative to the housing, and in this way, enables emission or reception of light from different directions. Admittedly, with these optoelectronic sensor devices, in the installed state, adaption to the spatial installation and transmitting and receiving conditions can be achieved, but these optoelectronic sensor devices are not compact devices as a result of the additional attachment. The additional attachment is, moreover, mechanically complex and susceptible to damage.

SUMMARY OF THE INVENTION

Accordingly, a primary object of the present invention is to devise an optoelectronic sensor device which can be produced as a compact unit and with the same external dimensions can be matched to different installation situations, especially can have the receiver or the transmitter on different sides.

The optoelectronic sensor device in accordance with the invention which achieves the aforementioned object is characterized in that, in the housing, there are an optics module and an electronics module. Therefore, this means that the housing, on the one hand, has an optics module for holding optical components, such as polarizers, lenses, mirrors, and diaphragms, and on the other hand, has an electronics module which has the electronics necessary for the optoelectronic sensor device so that the optics module is free of electronic components.

By separating and dividing the components necessary for the optoelectronic sensor device into the optics module, on the one hand, and the electronics module, on the other, a type of modular system is accomplished. This means that, depending on the requirements for the optoelectronic sensor devices, especially depending on the direction of light emission or reception which is necessary based on the installation situation of the optoelectronic sensor devices, at outside dimensions which are the same each time, specifically with the same housing, optoelectronic sensor devices with a transmitter and a receiver on different sides are available, and they can be produced from a small number of components which can be installed differently. In the simplest case, one such sensor device according to the invention can be built using an optics module and an electronics module which are installed in the housing, depending on the installation position of the optoelectronic sensor device, in different orientations. In an essentially rectanguloidal optoelectronic sensor device with one narrow side and one wide side, thus, there can be an optics module both for emission and reception of light on the narrow side and also alternatively on the wide side.

As stated above, the optoelectronic sensor device under consideration has a transmitter, which is preferably made as a laser diode, and/or a receiver, which is preferably made as a large-area photodiode. When the optoelectronic sensor device has a transmitter, it is provided, according to one preferred development of the invention, that the transmitter is located in a receiving device which is provided in the optics module. In this way, on the one hand, very simple installation of the transmitter in the optics module is achieved, and on the other hand, when the transmitter is installed in the optics module, accurate positioning and secure retention of the transmitter in the optics module are ensured. When the optoelectronic sensor device has a receiver, it can likewise be located in the optics module; this has similar advantages to those described above with respect to the transmitter.

According to one preferred development of the invention, however, it is provided that the receiver is part of the electronics module. Especially in the case of a large-area photodiode as the receiver, an especially simple and mechanically less susceptible electrical connection of the receiver is possible, and in addition, it is possible to check and/or adjust the complete electronics unit before installation in the housing. Thus, an already completely checked electronics module can be installed in the housing. In this respect, it is preferably provided that the electronics module has all the components necessary for the optoelectronic sensor device.

The electronics module can have a conventional circuit board as the base on which the individual electronic components are mounted. However, according to one preferred development of the invention, it is provided that the electronics module has a flexible conductor film. Preferably, this conductor film can, moreover, be folded such that the conductor film can be fitted exactly into the housing of the optoelectronic sensor device after appropriate folding. By a correspondingly altered and matched folding of the flexible conductor film, adaptation to another housing or to a housing in which the optics module is installed differently is easily possible. Moreover, if the receiver in the form of a large-area photodiode is already located on the conductor film, by the corresponding folding of the conductor film or by another arrangement of the conductor film the photodiode can be located at different points in the housing according to different requirements for the optoelectronic sensor. Of course, it is also possible to locate the photodiode at different locations of the conductor film.

The optics module can be inserted into the housing of the optoelectronic sensor device in different ways. It is also possible, for example, to place the optics module on the inside wall of the housing and to cement it there, or to clamp it between two opposite walls. According to one preferred development of the invention, however, it is provided that, in the housing, there are receiving means, the optics module has engagement means and the optics module is attached in the housing by engagement of the engagement means in the receiving means. In this way, on the one hand, especially simple holding of the optics module in the housing is achieved, and on the other hand, thus, accurate and always reproducible positioning and alignment of the optics module in the housing are ensured.

The receiving means and the engagement means must, of course, correspond to one another. All types which prevent slipping of the optics module in the housing are possible for the receiving means and the engagement means. In particular, it is preferable if the receiving means and the engagement means are made as a tongue and groove system and/or the receiving means are made as holes and the engagement means accordingly are made as insertion pins. Especially secure holding is achieved when the engagement means are locked in the receiving means. If replacement of the optics module or modification of its arrangement or alignment in the housing is not desirable or necessary, in addition, the engagement means can be cemented in the receiving means.

It has already been stated that the housing can be made rectanguloidal, for example. If, generally speaking, the housing has two side walls at an angle to one another and if there is one light passage opening in one of the side walls, through which the light emitted by the transmitter or the light to be received by the receiver can pass, according to a preferred embodiment of the invention, it is provided that the engagement means of the optics module are made such that the optics module can be installed in the housing in at least two different orientations which correspond to the alignment of the optics module to the light passage opening which is provided in one side wall or the other. This development of the optoelectronic sensor device according to the invention thus makes it possible to have to manufacture only a single optics module which then can be installed in the housing in those orientations which differ from one another and which then correspond to the different installation situations, specifically the different directions into which light is to be emitted or from which light is to be received.

Alternatively, according to a preferred development of the invention, it is provided that the optics module in the housing is pivotally mounted around its lengthwise axis. If the optics module is installed in this way into the housing of the optoelectronic sensor device, with this optoelectronic sensor device, at least two different emission or receiving directions can be accomplished. If the housing has two side walls which are at an angle to one another, preferably perpendicular to one another, for the aforementioned use of the optoelectronic sensor device, a respective light passage opening is provided in each of the two side walls and the optics module is pivotally mounted in the housing such that, by turning the optics module, one of the two light passage openings can be chosen as the light passage opening which can be used for the optics module.

A more versatile application of the electronic sensor device can be achieved according to a preferred development of the invention by the two side walls of the housing which are at an angle to one another being connected to one another by means of a wall section shaped like cylindrical sector, in the two side walls and in the wall section shaped like a cylindrical sector, there is a continuous light passage opening and the optics module is pivotally mounted in the housing such that each area of the light passage opening can be chosen as the light passage opening which can be used for the optics module. In this way, an area for possible emission of light or reception of light can be achieved which extends over an angle of 90°. In particular, it is provided that the orientation of the optics module in the housing in the installed state can be manipulated from the outside, for example, using a screw which can be adjusted using a screwdriver.

Furthermore, the invention relates to an optoelectronic sensor device with a housing and a mounting element which is provided on the housing and with which the housing can be attached to the holding device, the mounting element having an undercut such that the mounting element, in cross section, on its end facing the housing, is narrower than on its end facing away from the housing.

It was noted above that one problem in optoelectronic sensor devices is their accurate and reproducible positioning when installed in a corresponding system. Occasionally, it is necessary to temporarily uninstall the optoelectronic sensor device in order to acquire, for example, access to an otherwise blocked area of the system. Here, it is desirable that the optoelectronic sensor can be easily uninstalled and then can be installed again reliably as the original installation situation and alignment of the optoelectronic sensor device are restored.

Accordingly, a further object of the invention is to provide an optoelectronic sensor device which enables simple, reliable and reproducible installation and alignment.

The optoelectronic sensor device in accordance with the invention with which the aforementioned object is achieved is characterized in that the side edges of the mounting element, on its end facing away from the housing, run at an acute angle to one another. If the optoelectronic sensor device according to the invention is mounted using this mounting device on a holding device which has a correspondingly shaped and dimensioned receiving device in the form of a receiving rail and its side walls preferably likewise run at an acute angle to one another, then, when the optoelectronic sensor device is pushed into the holding device, using the mounting element, exactly one position is defined at which the mounting element cannot be pushed further into the holding device since the width of the recess of the holding device, on the one hand, and the width of the mounting element, on the other hand, correspond exactly to one another. If the optoelectronic sensor device is always inserted up to this stop point, its positioning can be reproduced at any time. When this stop point is reached, according to one preferred development of the invention, then especially reliable and mechanically stable holding of the optoelectronic sensor device in this position can be achieved in that, on the bottom of the mounting element, there is a recess into which a catch device which is attached to the holding device can be engaged. Preferably, it is provided that the catch device is a spring, especially a bent leaf spring.

The undercut can have different shapes, for example, a T-shape. However, according to one preferred development of the invention, it is provided that the mounting element, in cross section, is dovetail-shaped and/or the side edges of the mounting element run to one another in a V-shape.

In particular, there are now a plurality of possibilities for embodying and developing the optoelectronic sensor device in accordance with the invention which are explained in the following detailed description of preferred embodiments of the invention with reference to the accompanying drawings.

DETAILED DESCRIPTION OF THE INVENTION

Figure 1:
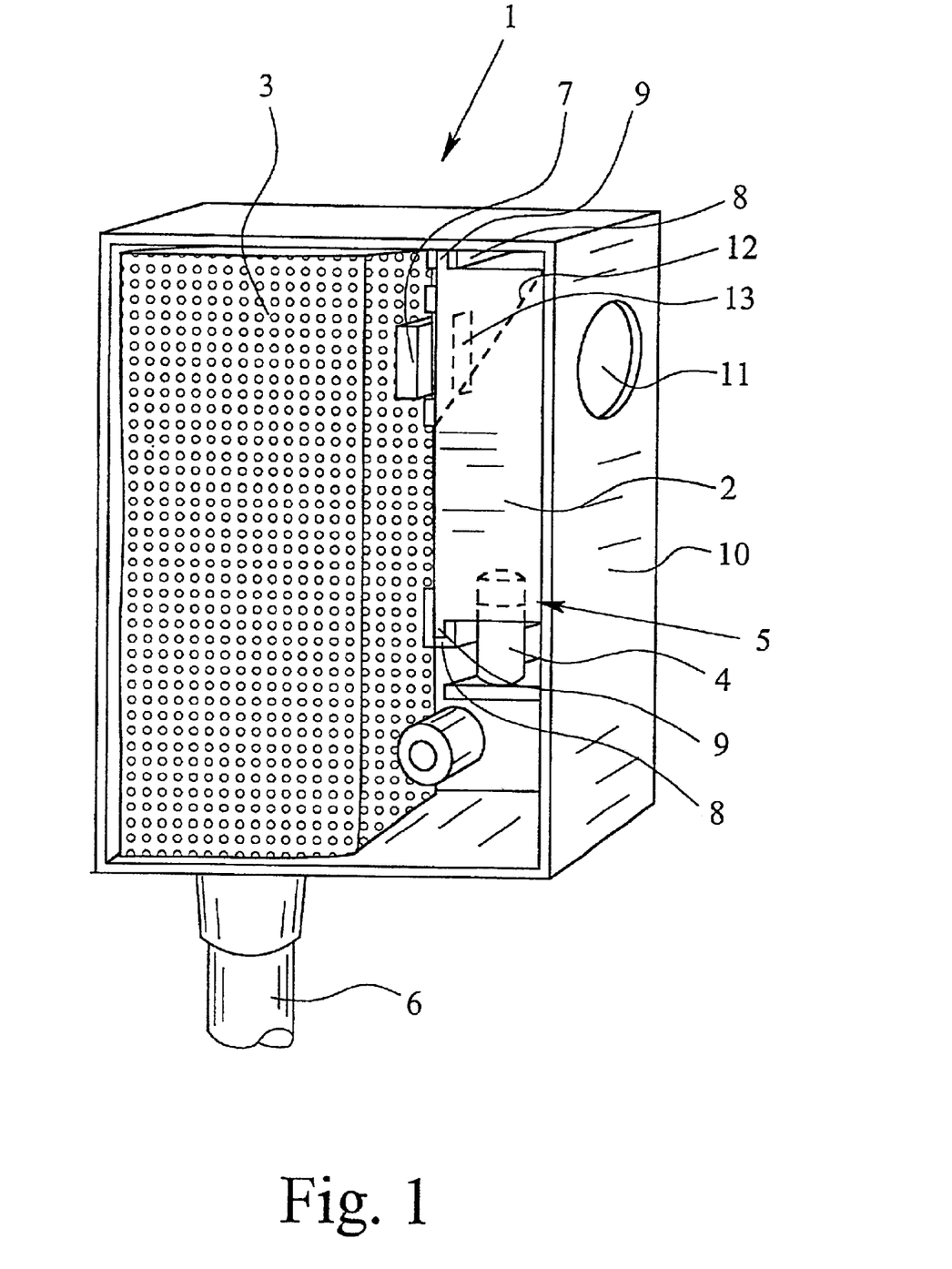
FIG. 1 shows the arrangement of an optics module and an electronics module in an optoelectronic sensor device which acts as a transmitting/receiving device according to one preferred embodiment of the invention.

FIG. 1 shows an optoelectronic sensor device with a housing 1 which is open on the side. The housing 1 contains an optics module 2 and an electronics module 3. The optics module 2 is made as an elongated, rectanguloidal and cross-sectionally rectangular tube and has a transmitter 4 which is located in a receptacle device 5 provided in the optics module 2. According to the preferred embodiment of the invention shown in FIG. 1, there is a laser diode as the transmitter 4. The terminals of the transmitter 4 which are connected either to the electronics module 3 or which lead directly into a cable 6 which is used, on the one hand, for power supply of the optoelectronic sensor device, and on the other, for data transmission are not shown.

The electronics module 3 is made here as a flexible, foldable conductor film, on which all electronic components necessary for the optoelectronic sensor device are attached. In addition, the electronics module 3 bears the receiver 7 which is made as a large-area photodiode according to the preferred embodiment of the invention which is shown in FIG. 1.

To attach the optics module 2 in the housing, in this receiving means 8, and on the optics module 2, there are engagement means 9 so that the optics module 2 can be mounted by the engagement of the engagement means 9 in the receiving means 8 in the housing 1. The receiving means 8 of the housing 1 and the engagement means 9 of the optics module 2 are made as a tongue and groove system.

The housing 1 of the optoelectronic sensor device is made rectanguloidal so that the side walls 10 are at a right angle to one another. In one of the side walls 10, specifically on one narrow side, there is a light passage opening 11. The optics module 2, on the one hand, and the electronics module 3 with the receiver 7 attached to it on the other, are now arranged in the housing 1 such that both light emitted by the transmitter 4 and also light which is incident on the optoelectronic sensor device and which is to be detected by the receiver 7 can pass through the light passage opening 11. Here, the receiver 7 is aligned such that the light incident on the light passage opening 11 reaches the receiver 7 directly. To use the same light passage opening 11 for the light emitted by the transmitter as well, in the optics module at 45° to its lengthwise axis, there is a partially transmitting mirror 12, which is shown in phantom in FIG. 1, so that the light emitted by the transmitter 4 is deflected by 90° and can travel through the light passage opening 11 from the housing 1 to the outside. However, some of the incident light passes through the partially transmitting mirror 12 and a diaphragm 13, which is likewise only shown in phantom in FIG. 1 and which is still a component of the optics module 2, and is incident on the receiver 7 which is located on the flexible, foldable conductor film of the electronics module 3.

Figure 2:
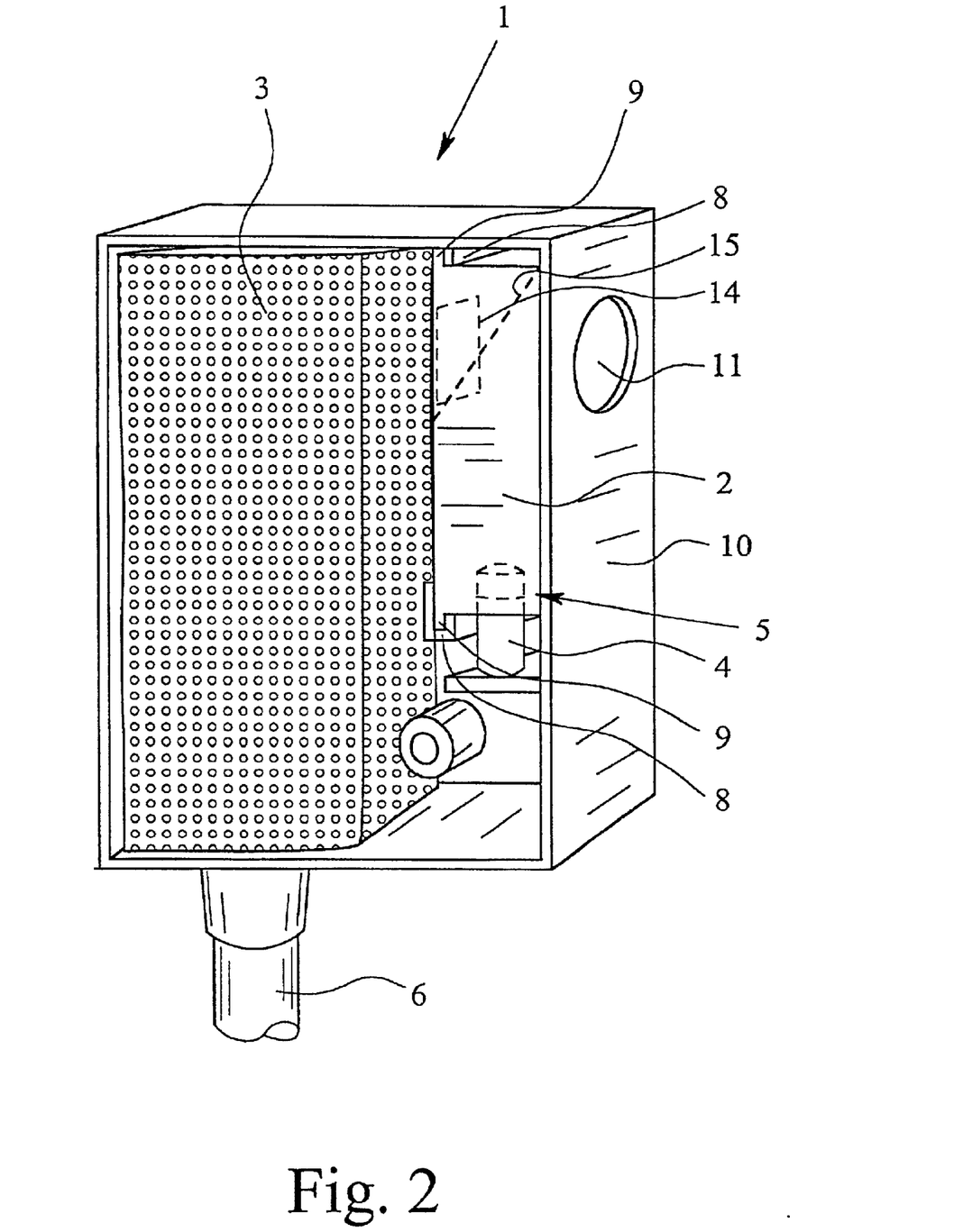
FIG. 2 shows the arrangement of an optics module and an electronics module in an optoelectronic sensor device which is used as a transmitting device according to another preferred embodiment of the invention.

The optoelectronic sensor device shown in FIG. 1 thus acts as a transmitter/receiver device. As shown in FIG. 2, with an identical housing 1 and essentially the same optics module 2, in which only the diaphragm 13 has been replaced by a completely closing cover 14 and the partially transmitting mirror 12 by replaced an essentially fully reflecting mirror 15, a pure transmitter device can be attained.

Regardless of whether the optoelectronic sensor device is a receiver device, a sensor device or a receiver/transmitter device, by using the optics module 2 and the electronics module 3, in this respect, different embodiments can be achieved such that the light passage opening 11 in the housing 1 can be effected in different side walls 10.

Figure 3A:
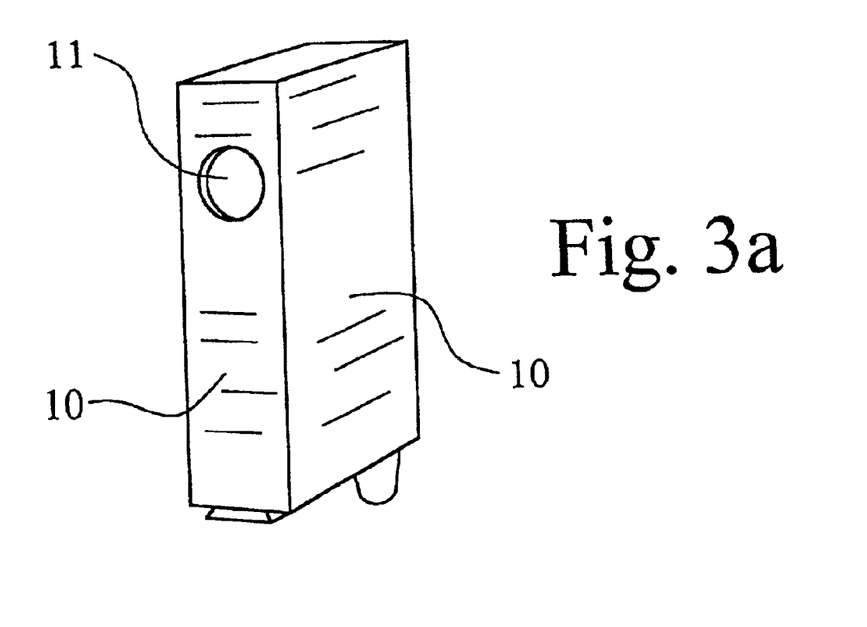
FIG. 3a shows an optoelectronic sensor device according to a preferred embodiment of the invention with the light passage opening on the narrow side of the housing.
Figure 3B:
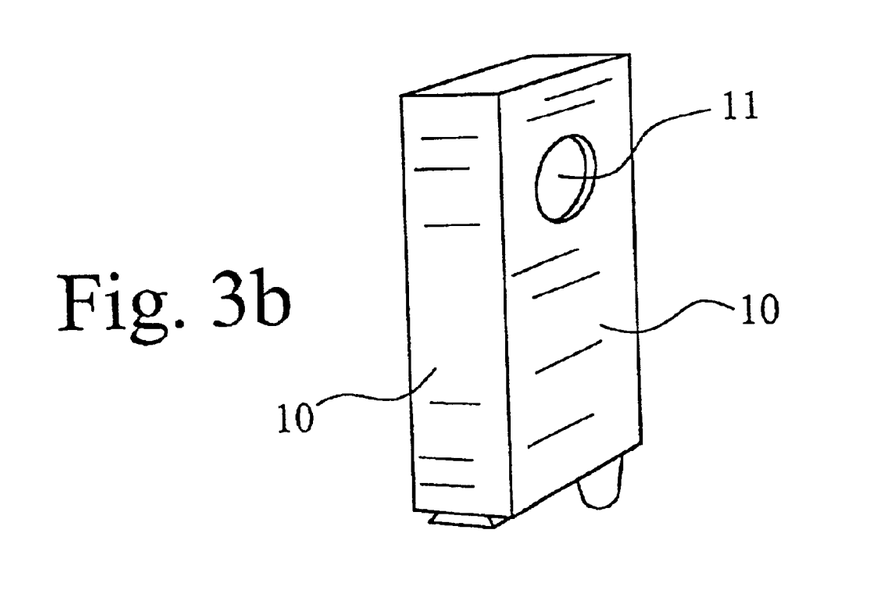
FIG. 3b shows an optoelectronic sensor device according to a preferred embodiment of the invention with the light passage opening on the wide side of the housing.

FIG. 3a shows an optoelectronic sensor device according to a preferred embodiment of the invention in which the housing 1 is rectanguloidal and the light passage opening 11 is on the narrow side of the housing 1. By the optics module 2 being installed in the housing 1 turned by 90° around its lengthwise axis and by the electronics module 3 being made as a flexible, foldable conductor film that can be folded and located differently in the housing 1, an embodiment can be achieved in which the light passage opening 11 is made on the wide side of the cuboidal housing 1, as shown in FIG. 3b.

Figure 4:
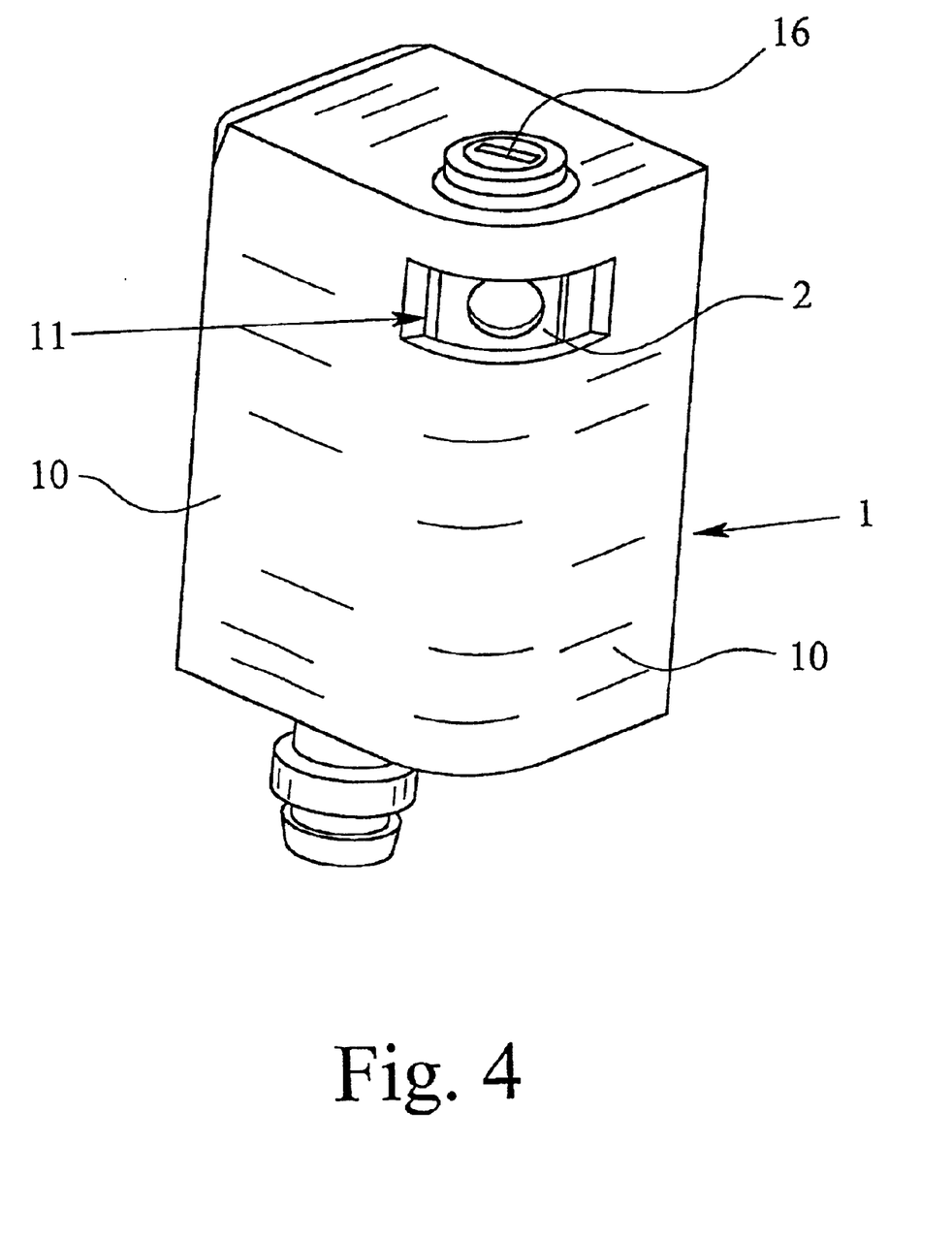
FIG. 4 shows an optoelectronic sensor device according to a preferred embodiment of the invention, in which the optics module is mounted to be able to turn by 90° in the housing.

FIG. 4 shows an optoelectronic sensor device according to a preferred embodiment of the invention in which the optics module 2 is pivotally mounted in the housing 1 to rotate around its lengthwise axis. In the optoelectronic sensor device shown in FIG. 4, the housing 1 is not made fully rectanguloidal, having a rounded edge at one corner. This rounding of the edge of the housing 1 is achieved by the two side walls 10 of the housing 1 that are at a right angle to one another being joined to one another by a wall section which has the shape of a cylindrical sector. In the two side walls 10, and in the wall section which has the shape of a cylindrical sector, there is a continuous light passage opening 11. The optics module 2 can now be positioned to turn in an angular range of 90° such that almost any area of the light passage opening 11 can be chosen as the light passage opening 11 which can be used for the optics module 2. In this way, an optoelectronic sensor device is achieved in which, even in the permanently installed state, calibration of the direction into which light is to be emitted and from which light is to be received is possible. According to the sensor device shown in FIG. 4, this calibration takes place using a setscrew 16 which is provided on the lengthwise axis of the optics module 2 and which can be turned using a screwdriver.

Figure 5:
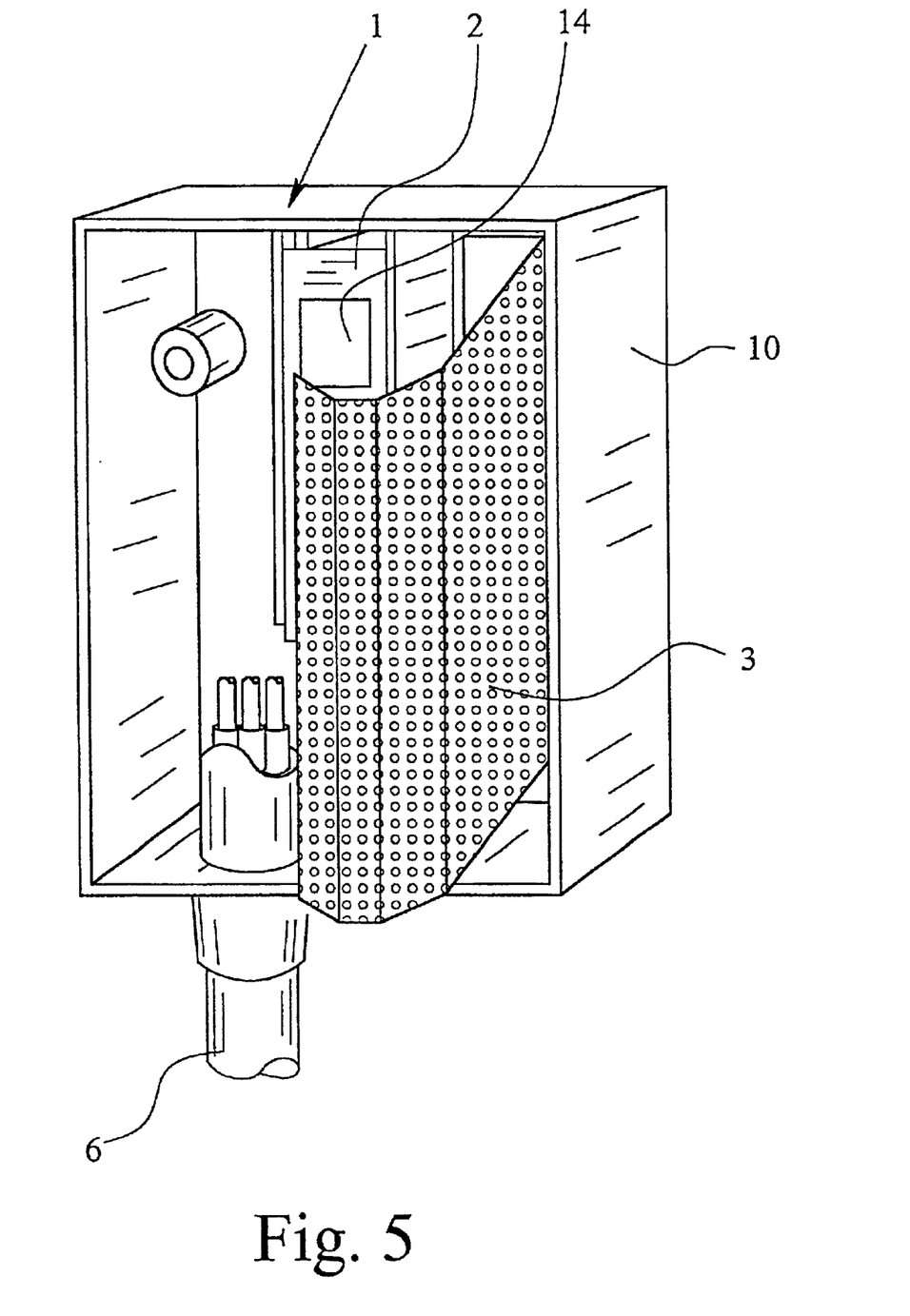
FIG. 5 shows the insertion of an electronics module which is made as a flexible, foldable conductor film into the optoelectronic sensor device according to a preferred embodiment of the invention.

After it has been repeatedly addressed that the electronics module 3 can be made as a flexible, foldable conductor film, it is apparent from FIG. 5 how such a conductor film is folded according to the dimensions of the housing 1 of the optoelectronic sensor device and fitted into it. The optoelectronic sensor device shown in FIG. 5 is one such embodiment in which the light passage opening 11 is on the wide side of the housing 1, specifically in the rear side wall 10. Accordingly the optics module 2 is located in the middle on the rear side wall 10. The electronics module 3 which is made as a flexible, foldable conductor film is then folded according to the inner structure of the housing 1 and the arrangement of the optics module 2 and fitted into the housing 1.

Figure 6:
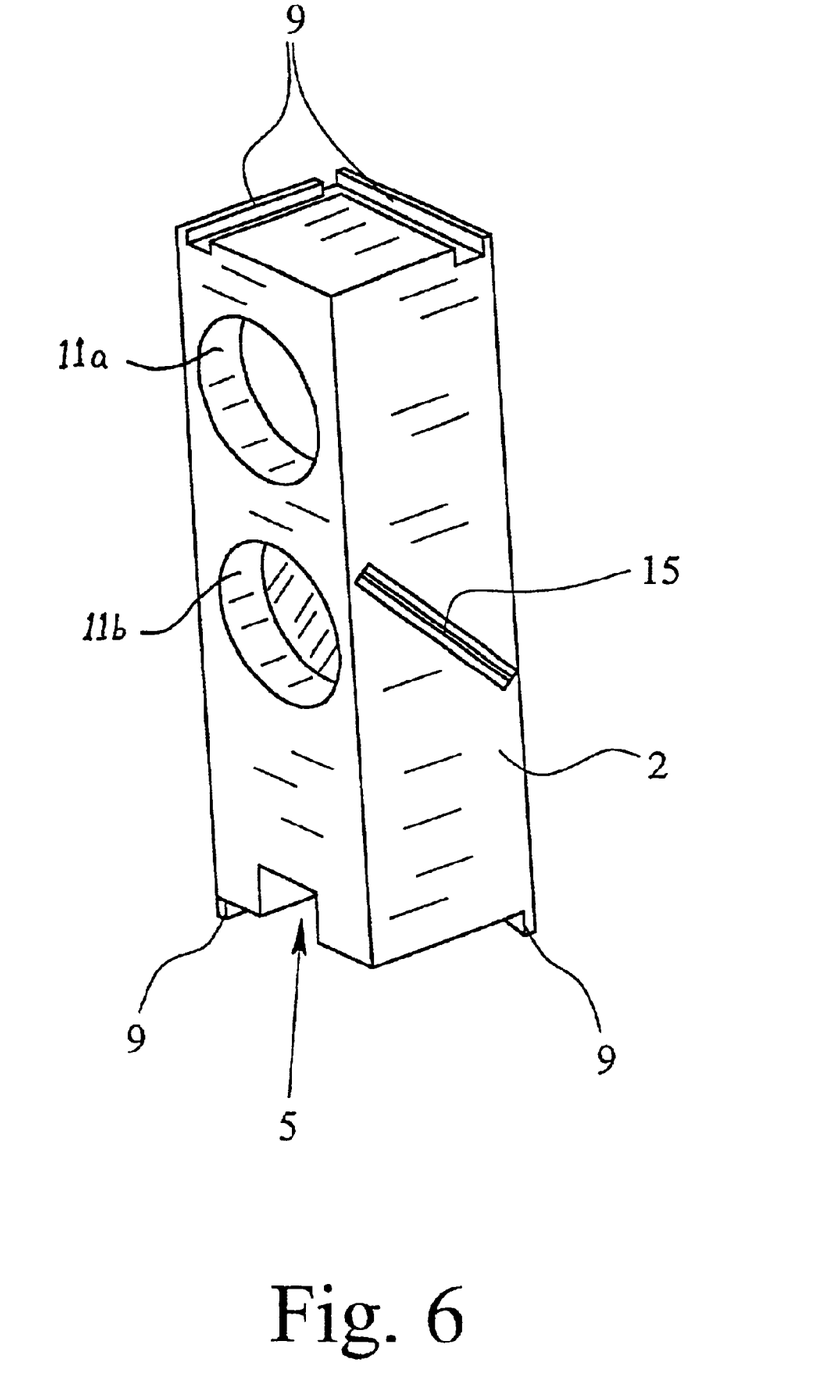
FIG. 6 shows an optics module for an optoelectronic sensor device according to preferred embodiment of the invention with light paths for the light to be emitted and for the light to be received that are separate from one another.

While FIG. 1 shows an optoelectronic sensor device which acts as a transmitter/receiver device, and in which the emission of light and reception of light take place through the same light passage opening 11, FIG. 6 shows an optics module 2 in which the light paths for emitted or incident light are not identical. Accordingly, the mirror which is located at an angle of 45° relative to the lengthwise axis of the optics module 2 for the emitted light is not a partially transmitting, but rather is an essentially totally reflecting mirror 15. Otherwise, the optics module 2 corresponds to those which are used for the above explained optoelectronic sensor devices according to the other preferred embodiments of the invention. Of course, for the optics module 2 shown in FIG. 6, a housing 1 is necessary which, for light emission and light reception, has not one common light passage opening 11, but two separate light passage openings 11a, 11b which are located next to one another and one above the other.

Figure 7:
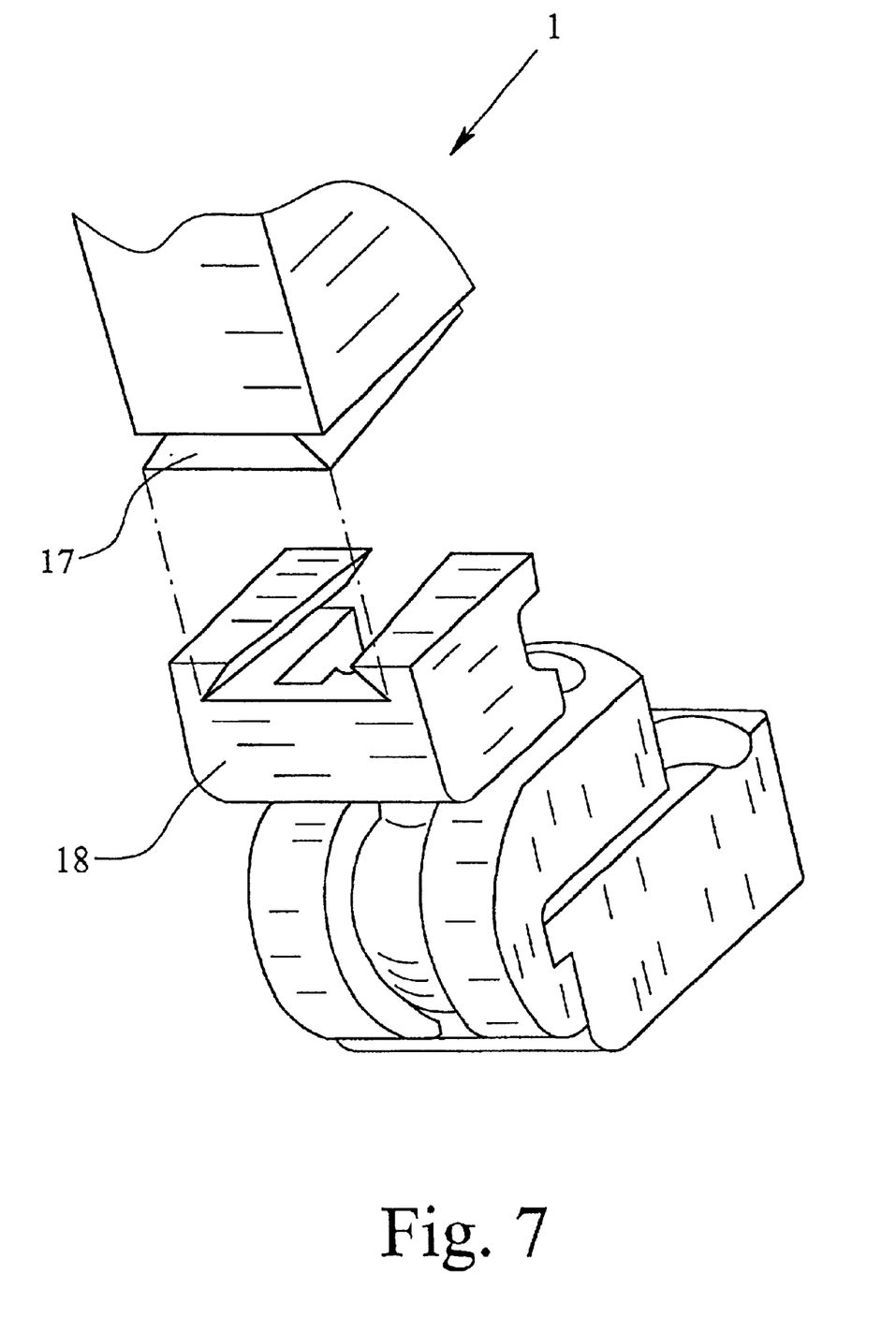
FIG. 7 shows an optoelectronic sensor device with a mounting device according to a preferred embodiment of the invention in the state separated from the corresponding holding device and FIG. 8 shows an optoelectronic sensor device with a mounting element according to a preferred embodiment of the invention which is fixed on the holding device using a leaf spring.
Figure 8:
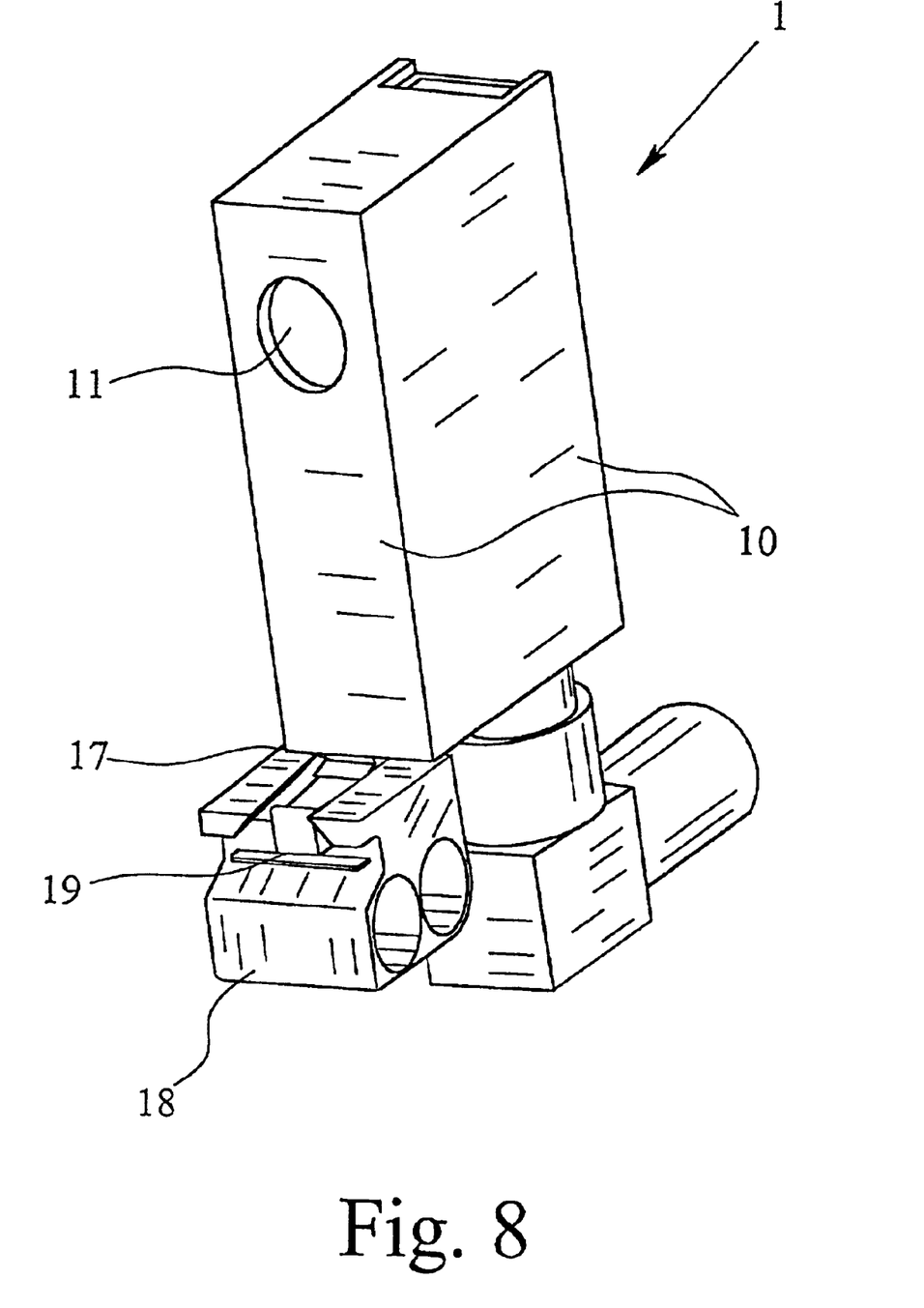

FIG. 7 shows an optoelectronic sensor device with a mounting element 17 which is provided on the housing 1 and with which the housing 1 can be attached to a holding device 18. The mounting element 17 on the housing 1 has an undercut which is dovetail-shaped in cross section so that the mounting element 17 can be inserted into a holding device 18 which is made according to the shape of the mounting element 17. Exact and reproducible positioning of the optoelectronic sensor device on the holding device 18 is achieved by the side edges of the mounting element 17, on its end facing away from the housing 1, running towards one another at an acute angle. Thus, over the length of the mounting element 17 its width changes so that, when the mounting element 17 is pushed into the holding device 18 at a specific point, specifically the stop point, it is not possible to push the mounting element 17 further into the holding device 18. Reliable and mechanically stable holding in this position is achieved, moreover, by there being a recess on the bottom of the mounting element 17 which is not further described and in which a catch device 19 which is attached to the holding device can be engaged. According to the preferred embodiment of the invention shown in FIG. 8, the catch device 19 is made as a bent leaf spring.

What is claimed is:

1. Optical proximity switch comprising:
   an outer housing, the walls of said outer housing enclosing a single interior chamber within which an optics module and a separate electronics module are located;
   wherein the electronics module has all electronic components necessary for operating the optical proximity switch,
   wherein the outer housing contains a receiving means for receiving the optics module and wherein the optics module comprises an engagement device, attached to at least one of said walls within the housing, by which the optics module is attached in the outer housing by engagement of the engagement device in the receiving means, and
   wherein the walls of the outer housing include two side walls at an angle to one another and a light passage opening in one of the side walls;
   wherein the engagement device of the optics module is received by said receiving means in a manner for installing the optics module in the interior chamber of the housing in each of at least two different orientations which correspond to an alignment of the optics module relative to the light passage opening.

2. Optical proximity switch as claimed in claim 1, further comprising a transmitter, wherein the transmitter is located in a receptacle device which is provided in the optics module.

3. Optical proximity switch as claimed in claim 2, wherein the transmitter is a laser diode.

4. Optical proximity switch as claimed in claim 1, further comprising a receiver, wherein the receiver is a component of the electronics module.

5. Optical proximity switch as claimed in claim 4, wherein the receiver is a large-area photodiode.

6. Optical proximity switch as claimed in claim 1, wherein the electronics module comprises a flexible, foldable conductor film.

7. Optical proximity switch as claimed in claim 1, wherein the receiving means and the engagement device comprise one of holes and pins and a tongue and groove system.

8. Optical proximity switch as claimed in claim 1, wherein the engagement device is engaged in the receiving means.

9. Optical proximity switch as claimed in claim 1,
wherein the optics module is pivotally mounted in the interior space of the housing for rotation around a longitudinal axis thereof.

10. Optical proximity switch as claimed in claim 9, wherein the walls of the housing include two side walls which are at an angle to one another;
wherein a light passage opening is provided in each of the side walls and the optics module is pivotally mounted in the housing enabling the optics module to be selectively aligned with either one of the two light passage openings.

11. Optical proximity switch as claimed in claim 9, wherein two side walls of the housing are at an angle to one another and are connected to one another by a cylindrical sector-shaped wall section having a continuous light passage opening; and
wherein the optics module is pivotally mounted in the housing for positioning at any area of the light passage opening.

12. Optical proximity switch as recited in claim 1, wherein the electronics module is configurable to adapt to each of the different orientations of the optics module.

* * * * *